United States Patent [19]

Trefney

[11] 4,274,156
[45] Jun. 16, 1981

[54] MONITOR FOR RF TRANSMITTER

[75] Inventor: Ralph P. Trefney, Valley View, Ohio

[73] Assignee: Bird Electronic Corporation, Solon, Ohio

[21] Appl. No.: 870,340

[22] Filed: Jan. 18, 1978

[51] Int. Cl.³ .................... H04B 1/04; H04B 17/00
[52] U.S. Cl. .................................... 455/115; 455/117
[58] Field of Search ............... 325/2, 151, 152, 31, 325/67, 133, 176, 187, 150; 343/17.7, 703, 894; 340/657, 660–663, 521, 517; 455/9, 67, 115, 117

[56] References Cited

U.S. PATENT DOCUMENTS

| | | | |
|---|---|---|---|
| 2,854,663 | 9/1958 | Maynard | 325/133 |
| 3,020,529 | 2/1962 | Turner | 325/150 |
| 3,599,195 | 8/1971 | Boyko | 340/521 |
| 3,713,129 | 1/1973 | Buchholz | 340/517 |
| 3,717,863 | 2/1973 | van Kempen et al. | 340/521 |
| 3,870,957 | 3/1975 | Straw | 325/187 |
| 4,096,441 | 6/1978 | Schwartz | 325/67 |
| 4,142,238 | 2/1979 | Brandt et al. | 340/526 |

OTHER PUBLICATIONS

Noller Co. Bulletin No. 1007/SL970064, Issue 2; "Remote Control & Status Monitoring Systems–Centra–Line 430", Copy in A.V. 233 Search Room.

*Primary Examiner*—Marc E. Bookbinder
*Attorney, Agent, or Firm*—Pearne, Gordon, Sessions, McCoy & Granger

[57] ABSTRACT

A device for monitoring operating conditions of an RF transmitter, including the RF power output thereof, and the reflected voltage wave on a transmission line therefor, and for promptly switching the transmitter off whenever a faulty condition is detected. The device includes two voltage comparators that receive voltage signals representative of transmitter power output and the magnitude of the reflected voltage wave on an associated transmission line, and which generate an output signal whenever a respective voltage signal varies a predetermined amount from a preset reference voltage level. The two voltage comparators are activated by a relay operated by the carrier wave of the transmitter so that the comparators function only when the transmitter is operating. The output signals from the two comparators are transmitted together with any other signals indicating a faulty condition, to a NAND gate which outputs an alarm signal whenever at least one fault signal is received. The alarm signal is then processed to switch off the transmitter and, if desired, to simultaneously switch on an alternate backup transmitter. A third comparator associated with the amplifier circuit for the meter that indicates the transmitter power output is used to provide a transmitter-on condition indication once the transmitter reaches a power level of 2% of its output power after being switched on.

1 Claim, 5 Drawing Figures

MONITOR FOR RF TRANSMITTER

BACKGROUND OF THE INVENTION

This invention relates to devices for monitoring RF transmitters to detect the occurrence of faulty conditions and for automatically switching off the transmitter whenever such a faulty condition is detected. More particularly, the invention relates to such a device wherein an extremely fast switching capability is achieved, such as 25 microseconds.

Recent developments in communication technology have been accompanied by a need for high-speed RF transmitter monitoring systems. In fact, recent FCC regulations make RF transmission monitoring and supervision mandatory. Prior art devices for monitoring transmitter power, etc., have been capable of switching response times to up to 50 milliseconds, however, current requirements indicate a need for response times as fast as 25 microseconds.

The types of transmitters for which the device of the present invention is designed include radio repeater systems, such as are used in the two-way communication field, and in the more recent computer terminal systems for dissemination of printed line information. Such systems require condition monitors for driver outputs, final outputs, VSWR at various points, as well as tamper alarms, cooling water flow, air flow, standby power fall-off, etc.

The device of the present invention satisfies the requirements indicated above and affords other features and advantages heretofore not obtainable.

SUMMARY OF THE INVENTION

It is among the objects of the invention to provide an improved monitoring device for detecting the occurrence of faulty conditions in RF transmitters and for outputting a signal that automatically switches off the transmitter when the faulty condition is detected.

Another object of the invention is to provide much faster response times for monitoring devices of the type described.

The above objects and advantages are accomplished by the device of the invention which provides a novel system for monitoring operating conditions of an RF transmitter, including the RF power and the reflected voltage wave on a transmission line therefrom and for promptly switching off the transmitter when a faulty condition is detected.

This system includes a first comparator for comparing an input voltage signal representative of the RF power output of the transmitter, with a predetermined reference voltage, and for generating an output signal whenever the voltage signal varies a predetermined amount from the predetermined reference voltage, and a second voltage comparator for comparing another input voltage signal representative of the reflected voltage wave with another predetermined reference voltage and for generating another output signal whenever the voltage signal varies a predetermined amount from the predetermined reference voltage. The two comparators are activated by a relay operated by the output carrier wave of the transmitter so that the comparators will not function unless the transmitter is switched on. Preferably, a time delay is provided to permit the transmitter to reach a normal power level before the comparators are activated. After the initial delay period, the response time is extremely fast—for example, 25 microseconds.

The output signals from the two comparators, as well as output signals from any other desired sensors are supplied to a NAND gate adapted to receive any or all of such signals representative of a faulty condition and to output an alarm signal voltage whenever at least one input voltage signal is received. The alarm signal voltage is processed by a suitable circuit to switch off the primary RF transmitter and, if desired, to switch on an alternate backup transmitter.

Preferably, a Schmitt trigger is inserted in the system before the NAND gate so that all output signal voltages representative of a faulty condition are first processed through the Schmitt trigger to provide a steady pulse. As another aspect of the invention, a third comparator is provided, preferably in association with an interconnect amplifier circuit for a meter that indicates the transmitter power output, to sense an initial transmitter power condition at approximately that point when the transmitter reaches a power level of 2% of its output power after being switched on. This confirms to an operator that the transmitter has, in fact, been switched on and that any faulty condition subsequently detected is, in fact, a true indication of a transmitter condition.

DESCRIPTION OF THE PREFERRED EMBODIMENT

Figure 1:
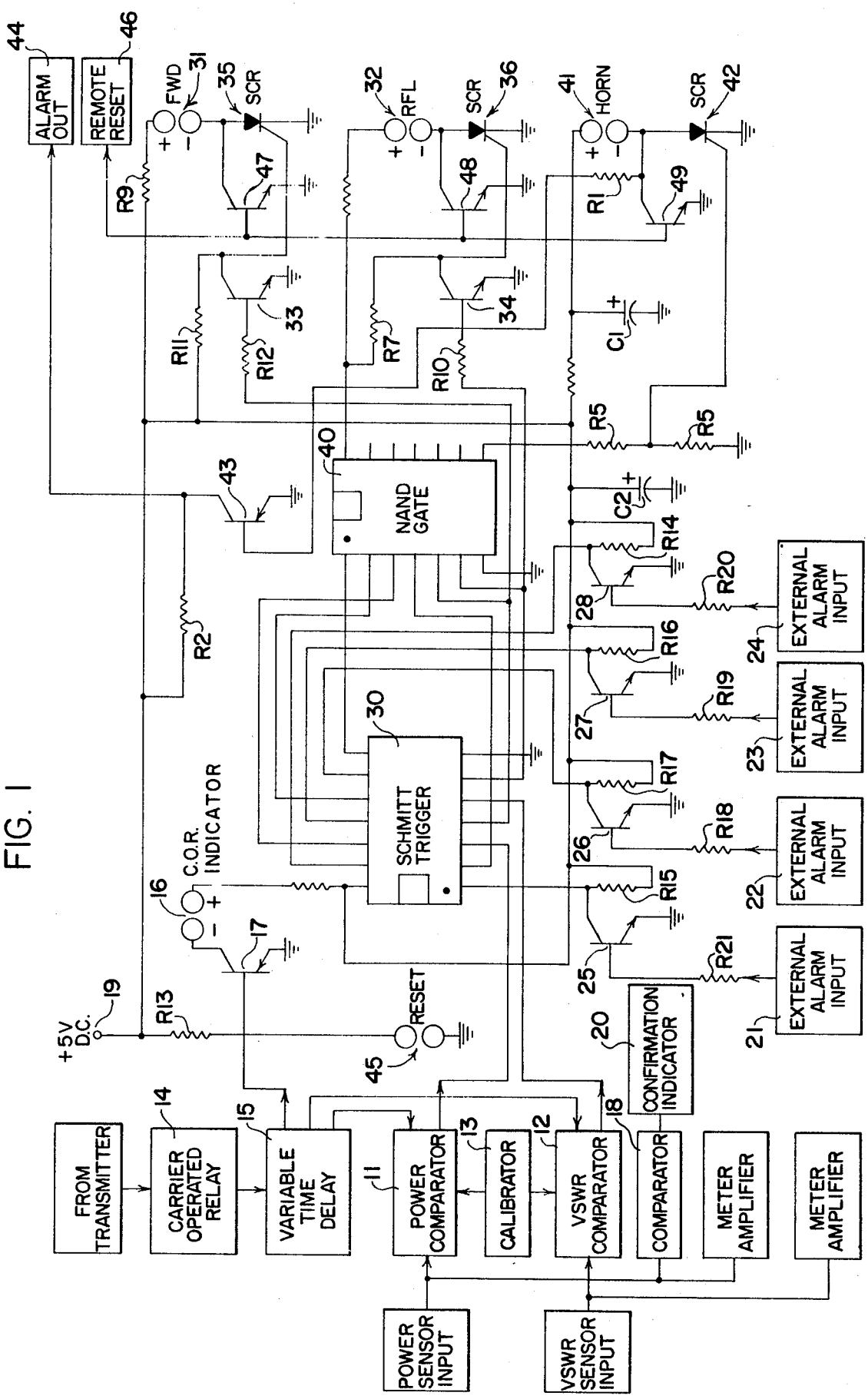
FIG. 1 is a circuit diagram partly in block form of the RF transmitter monitoring system of the invention.

Referring more particularly to the drawings and initially to FIG. 1, there is shown an RF transmitter monitoring system embodying the invention for use in association with standard sensing devices for such conditions as transmitter output power, reflected voltage wave level on a transmission line for the transmitter, and other optional conditions, such as cooling water flow, convective air flow, standby power fall-off, etc. When the system detects a faulty condition, an alarm signal is outputted to associated equipment for switching off the RF transmitter being monitored and, if desired, for switching on an alternate backup transmitter.

The system includes a power comparator 11 adapted to receive an input signal voltage representative of the power output of the transmitter, and a voltage standing wave ratio (VSWR) comparator 12 adapted to receive a signal from a sensing device, such as a coaxial line section of the type manufactured by Bird Electronic Corporation of Solon, Ohio, and designated as Model Nos. 4715, 4716, 4610, 4802, 4905, and 4931 line sections. The comparators 11 and 12 utilize solid state circuitry and are calibrated through a conventional calibrating circuit indicated in block form by the numeral 13.

The comparators are activated by a carrier-operated relay 14 (hereinafter C.O.R.) which receives an input signal from the squelch circuit for the transmitter. The C.O.R. 14 includes a variable time delay circuit 15 so that the relay output when the C.O.R. is activated is not utilized to activate the power comparators 11 and 12 until sufficient time has elapsed once the transmitter has been switched on for a normal power level to be reached. If the time delay circuit 15 were not included, the C.O.R. would activate the comparators 11 and 12 immediately upon switching on of the transmitter and a "faulty" condition would be detected since insufficient time would have elapsed for the transmitter to reach normal transmitting power. When the C.O.R. 14 outputs a voltage signal, an indicator 16 comprising a light-emitting diode (hereinafter L.E.D.) is activated to give a visual indication of that condition. The indicator 16 is actuated through PNP transistor 17.

A confirmation comparator 18 is provided to sense an initial transmitter power condition at approximately that point when the transmitter reaches a power level of about 2% of its output power after being switched on. The confirmation comparator 18 receives an input voltage signal from the same sensor as the power comparator 11 and when the 2% of transmitter output power level is reached, the comparator 18 activates a transmitter power confirmation indicator 20. This confirms to an operator that the transmitter has, in fact, been switched on and that any faulty condition subsequently detected is, in fact, a true indication of a transmitter condition. The confirmation comparator 18 is preferably located in association with a meter amplifier circuit as shown in FIG. 1. Also, the two meter amplifiers are preferably designed to buffer the dynamics of the two meters, and, thus, avoid any sensory lags due to back EMF.

A "high" condition voltage (+5 VDC) for solid state components is supplied from a source 19.

In addition to the faulty condition voltage signals outputted by the comparators 11 and 12, four external alarm inputs 21, 22, 23, and 24 are provided to permit optional monitoring of other conditions as desired. The input signals are processed by NPN transistors 25, 26, 27, and 28.

The power comparators 11 and 12 compare the input voltage signals supplied thereto with respective predetermined reference voltages and when the input signal varies a predetermined amount from the reference voltage, an output signal is generated and transmitted together with any other faulty-condition input voltages from the external alarm inputs 21, 22, 23, and 24 to an integrated circuit Schmitt trigger 30 which is a hex Schmitt trigger inverted TTL No. SN 7414 with six inputs and six outputs. The Schmitt trigger 30 processes the input signals and outputs clean, steady pulses to eliminate noises, etc.

From the Schmitt trigger 30, outputs representative of the comparator outputs are transmitted to a faulty-power-condition indicator and a VSWR faulty condition indicator, such as the indicators 31 and 32 comprising standard LED's with buffer NPN transistors 33 and 34, and respective silicone-controlled rectifiers 35 and 36 (hereinafter SCR's).

The Schmitt trigger outputs are also all transmitted to an integrated circuit NAND gate 40 (TTL No. 5N7430) which is a single output device with eight inputs. The sole output from the NAND gate 40 is transmitted to a horn 41 to provide an audible alarm when a faulty condition occurs, the horn having an associated SCR 42 and NPN transistor 49. Also, the output signal from the NAND gate 40 is transmitted through the resistor R1 to PNP transistor 43, thence to the system output 44 identified as "ALARM OUT" and ultimately to associated equipment to switch off the transmitter being monitored and, if desired, switch on an alternate transmitter.

A reset switch 45 is provided to switch off the L.E.D. indicators 31 and 32 after the necessary switching function has been accomplished through the system output 44. The reset switch 45 is also used to switch off the horn 41. A remote reset circuit 46 is also provided to switch off the L.E.D. indicators 31 and 32 and horn 41 through NPN transistors 47, 48, and 49.

The values for the other circuit components of the alarm circuit shown in FIG. 1 are given in Table I below.

TABLE I (FIG. 1)

| Circuit Element | Resistance |
|---|---|
| R 1 | 100 |
| R 2 | 4.7K |
| R 3 | 68 |
| R 4 | 1K |
| R 5 | 3.3K |
| R 6 | 150 |
| R 7 | 10K |
| R 8 | 1K |
| R 9 | 150 |
| R 10 | 100 |
| R 11 | 10K |
| R 12 | 1K |
| R 13 | 1K |
| R 14 | 4.7K |
| R 15 | 4.7K |
| R 16 | 4.7K |
| R 17 | 4.7K |
| R 18 | 1K |
| R 19 | 1K |
| R 20 | 1K |
| R 21 | 1K |
| Circuit Element | Capacitance |
| C1 | 100 mfd |
| C2 | 100 mfd |

Figure 2:
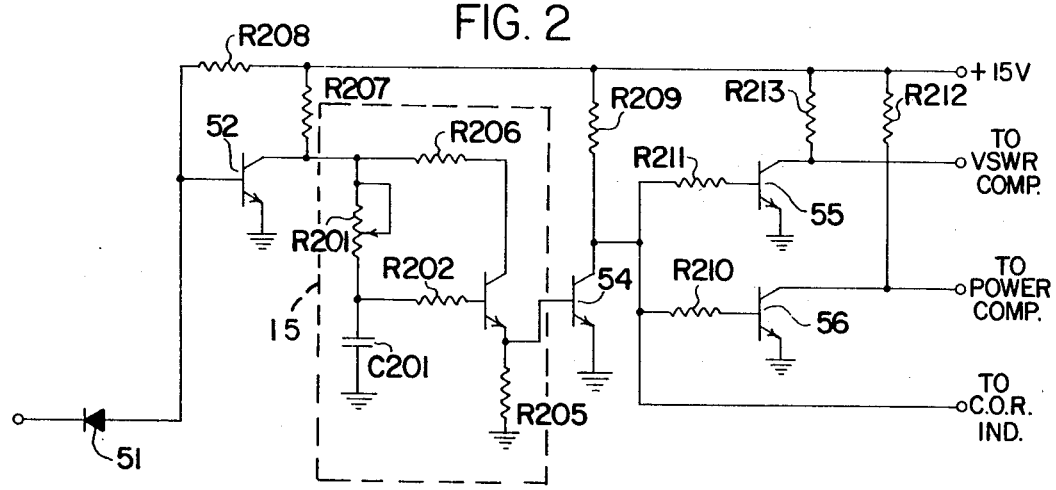
FIG. 2 is a schematic diagram showing in greater detail the circuitry for the carrier-operated relay and variable time delay circuits shown in block form in FIG. 1.

FIG. 2 shows the circuitry for the C.O.R. 14 and the integral adjustable time delay circuit 15. As indicated above, the C.O.R. 14 is activated by a signal from the system being monitored such as by a repeater system receiver squelch circuit. When the voltage signal is sensed, the control circuit for the transmitter is activated and at that same instant the signal from the keying circuit is applied to the C.O.R. circuit 14 which requires a dry contact closure to ground.

The C.O.R. circuitry includes an SR 51 and an NPN transistor 52. The instant that gating occurs through the SR 51, the adjustable time delay circuit 15, or pulse stretcher, is activated and by adjustable time delay, the comparators 11 and 12 are initiated. It is necessary to have some time delay to allow for transmitter power build-up. Should the comparators 11 and 12 be actuated before adequate power build-up, they would not sense enough power and, thus, would output a fault signal causing a false alarm. Likewise, if the transmitter is left in a standby condition, and the comparators were left on, they would not sense sufficient power and, again, would cause a false alarm.

The adjustable time delay circuit 15 (shown enclosed in a dashed-line block in FIG. 2) is adjustable from 200 microseconds to 25 milliseconds using the adjustable rheostat R201. As indicated in FIG. 2, the output from the adjustable time delay circuit 15 is applied to NPN transistor 54 and then split and applied to NPN transistors 55 and 56 while another branch transmits the voltage signal to the C.O.R. indicator 16. From the transistors 55 and 56, the respective signals are transmitted to the comparators 11 and 12.

The values for the other circuit components of the circuitry shown in FIG. 2 are listed in Table II below.

TABLE II
(FIG. 2)

| Circuit Element | Resistance (ohms) |
|---|---|
| R 201 | 1 meg. |
| R 202 | 3.3 K |
| R 205 | 1 K |
| R 206 | 4.7 K |
| R 207 | 1 K |
| R 208 | 10 K |
| R 209 | 1 K |
| R 210 | 3 K |
| R 211 | 3 K |
| R 212 | 1 K |
| R 213 | 1 K |
| Circuit Element | Capacitance |
| C 201 | 1 mfd |

Figure 3:
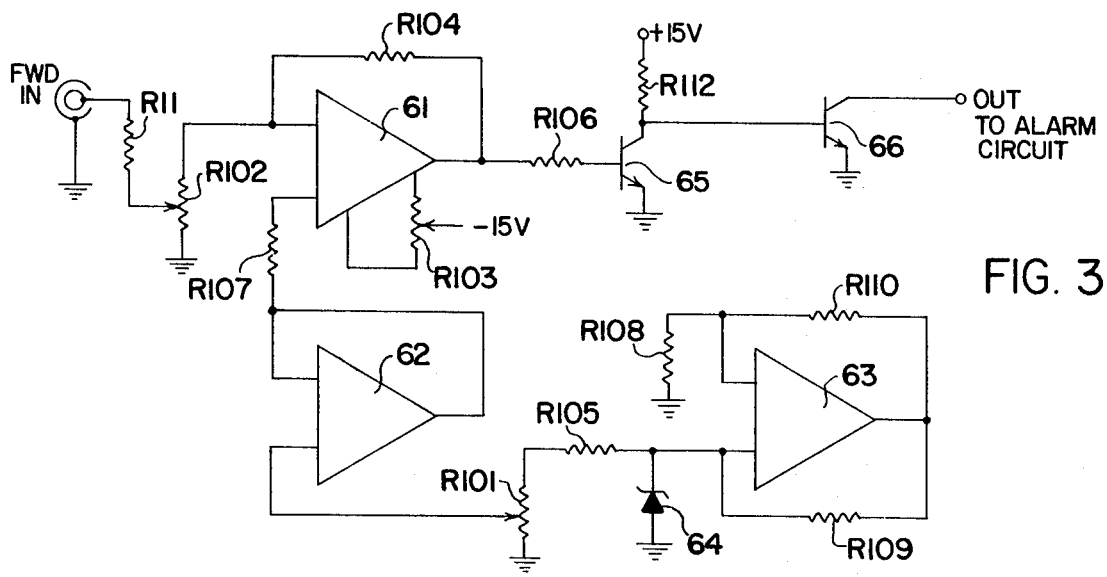
FIG. 3 is a schematic diagram showing in greater detail the circuitry for the power comparator shown in block form in FIG. 1.
Figure 4:
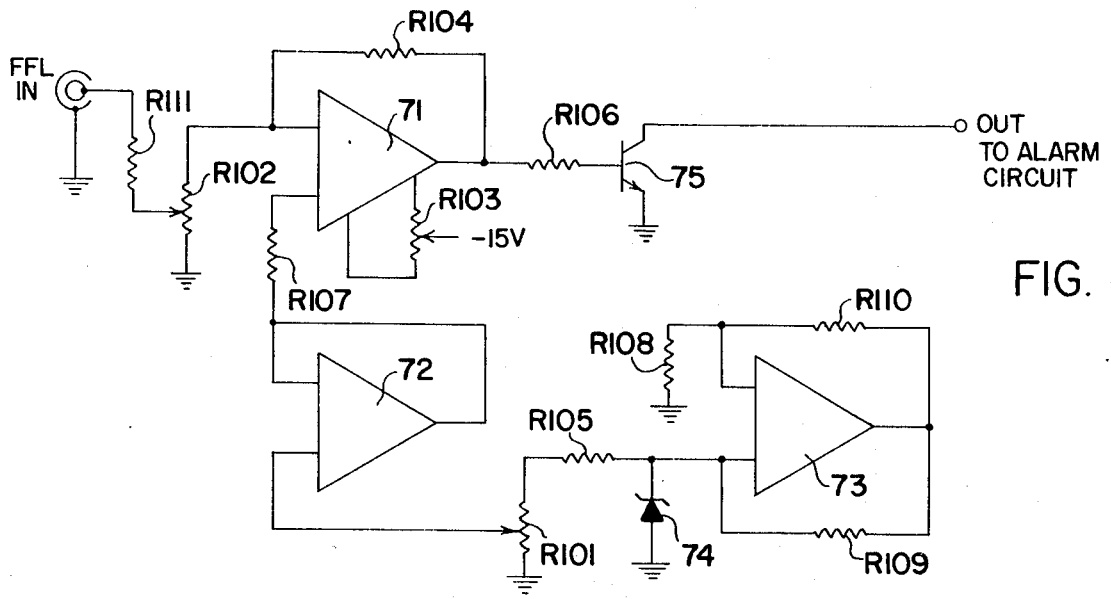
FIG. 4 is a schematic diagram showing in greater detail the circuitry for the VSWR comparator shown in block form in FIG. 1.

FIGS. 3 and 4 illustrate the circuitry for the comparators 11 and 12, respectively. The comparators are designed to accept millivolt level inputs from standard power sensors, or power sensor elements, as indicated above. The input resistance can be varied from 500 ohms to 100,000 ohms using the rheostat R102. Each comparator has a highly stabilized reference voltage source that is adjustable using the respective adjustable rheostats R103 from one millivolt to 100 millivolts.

The circuitry for the power comparator 11 includes solid state amplifiers 61, 62, and 63. The amplifiers are integrated circuit elements and include a No. 701 amplifier (61) and two No. 641 amplifiers (62 and 63). The circuitry also includes the zener diode 64 and two NPN transistors 65 and 66. The output from the power comparator 11 is applied to the input for the Schmitt trigger 30 and thence to the power fault indicator 31.

FIG. 4 shows the circuitry for the VSWR comparator 12, the circuitry being essentially identical to that for the power comparator 11, except that there is no transistor corresponding to the transistor 66. The sensitivity, reference voltage level, and set point are adjustable using the variable rheostats R101, R102, and R103, respectively, and the circuitry includes integrated circuit amplifiers 71, 72, and 73, including a No. 701 amplifier (71) and two No. 641 amplifiers (72 and 73). The circuitry also includes a zener diode 74 and an NPN transistor 75. The output from the comparator 12, when the input voltage level varies a predetermined amount from the reference voltage level, is applied, on the one hand, to the VSWR fault indicator 32, and to the respective terminal of the Schmitt trigger 30.

The values for the other circuit components of the circuitry shown in FIGS. 3 and 4 are listed in Tables III and IV below.

TABLE III
(FIG. 3)

| Circuit Element | Resistance (ohms) |
|---|---|
| R 101 | 500 |
| R 102 | 1 meg. |
| R 103 | 10 K |
| R 104 | 5.6 meg. |
| R 105 | 6.8 K |
| R 106 | 470 |
| R 107 | 100 K |
| R 108 | 6.8 K |
| R 109 | 680 |
| R 110 | 1.8 K |
| R 111 | 100 K |
| R 112 | 100 K |

TABLE IV
(FIG. 4)

| Circuit Element | Resistance (ohms) |
|---|---|
| R 101 | 500 |
| R 102 | 1 meg. |
| R 103 | 10 K |
| R 104 | 5.6 meg. |
| R 105 | 6.8 |
| R 106 | 470 |
| R 107 | 100 |
| R 108 | 6.8 |
| R 109 | 680 |
| R 110 | 1.8 |
| R 111 | 100 K |

Figure 5:
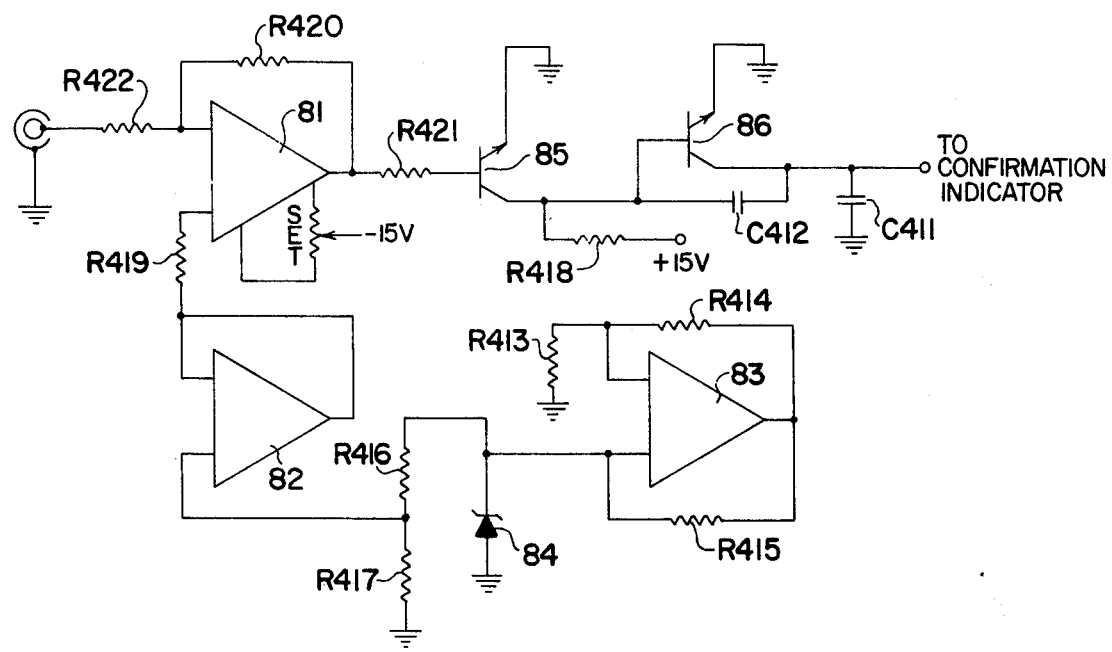
FIG. 5 is a schematic diagram showing in greater detail the circuitry for the transmitter power-on confirmation comparator shown in block form in FIG. 1.

FIG. 5 illustrates the circuitry for the confirmation comparator 18 which is similar to that of the comparators 11 and 12. The circuitry includes solid state amplifiers 81, 82, and 83 which are integrated circuit elements and include a No. 101 amplifier (81) and two No. 741 amplifiers (82 and 83). The circuitry also includes the SCR 84 and two NPN transistors 85 and 86. The output from the confirmation comparator 18 is applied to the confirmation indicator 20.

The values for the other circuit components of the circuitry shown in FIG. 5 are listed in Table V below.

TABLE V
(FIG. 5)

| Circuit Element | Resistance (ohms) |
|---|---|
| R 413 | 6.8 K |
| R 414 | 1.8 K |
| R 415 | 680 |
| R 416 | 10 K |
| R 417 | 100 |
| R 418 | 10 K |
| R 419 | 100 K |
| R 420 | 5.6 meg. |
| R 421 | 470 |
| R 422 | 100 K |
| Circuit Element | Capacitance |
| C 411 | .001 mfd |
| C 412 | .001 mfd |

It will be noted that the comparators 11, 12, and 18 employ temperature compensated integrated circuits so as to provide a stable operation. The system is particularly adaptable for construction using plug-in type circuit boards for easy field replacement. Preferably, the board connector pins are arranged so as to allow any plug-in board to be inserted in a card rack in any order and interfaced with the alarm circuit for correct function.

It will also be noted that the system is readily adaptable to incorporate analog-to-digital multiplexed output capability. This will provide binary-coded decimal output so remote readout of actual power levels can be provided through telemetry links, or phone lines. X-Y recorder outputs may also be provided for logged time elapse record of transmitter powers or system performance parameters.

While the device of the invention has been shown and described with respect to a specific embodiment thereof, other modifications and variations of the specific device herein shown and described will be readily apparent to those skilled in the art and other modifications and variations of the specific device herein shown and described may be used without departing from the spirit and scope of the invention. Accordingly, the patent is not to be limited in scope and effect to the specific device herein shown and described, nor in any other way that is inconsistent with the extent to which the progress in the art has been advanced by the invention.

I claim:

1. A device for monitoring operating conditions of an RF transmitter having an output carrier wave, said operating conditions including the RF power output and reflected voltage wave thereof, and for promptly switching off said transmitter when a faulty condition is detected, comprising:

first comparator means comprising solid state circuit elements for comparing an input voltage signal representative of said RF power output with a predetermined reference voltage and for generating a first output signal when said voltage signal varies a predetermined amount from said predetermined reference voltage, second comparator means comprising solid state circuit elements for comparing another input voltage signal representative of said reflected voltage wave with another predetermined reference voltage and for generating a second output signal when said other voltage signal varies a predetermined amount from said predetermined reference voltage, relay means operated by the output carrier wave of said transmitter for activating said first and second comparator means, time delay means operatively associated with said relay means so that said first and second comparator means are actuated only when said transmitter is switched on and has reached a normal operating condition, a Schmitt trigger for conditioning said output voltage signals from said comparators to provide uniform steady voltage signals for transmission therefrom;

a NAND gate adapted to receive a plurality of voltage signals from said Schmitt trigger, including voltage signals representative of said output signals from said comparators, and to output an alarm signal voltage whenever at least one voltage signal is received whereby said alarm signal voltage may be used to switch off said transmitter.

* * * * *